United States Patent
Hairston

(10) Patent No.: US 7,026,853 B2
(45) Date of Patent: Apr. 11, 2006

(54) AUTOMATIC INTEGRATION RESET OFFSET SUBTRACTION CIRCUIT

(75) Inventor: Allen W. Hairston, Andover, MA (US)

(73) Assignee: BAE Systems Information and Electronic Systems Integration INC, Nashua, NH (US)

( * ) Notice: Subject to any disclaimer, the term of this patent is extended or adjusted under 35 U.S.C. 154(b) by 0 days.

(21) Appl. No.: 10/868,429

(22) Filed: Jun. 15, 2004

(65) Prior Publication Data

US 2005/0275446 A1 Dec. 15, 2005

(51) Int. Cl.
H03L 5/00 (2006.01)
(52) U.S. Cl. .................................................. 327/307
(58) Field of Classification Search ................ 327/336, 327/306–307, 94, 96; 330/9
See application file for complete search history.

(56) References Cited

U.S. PATENT DOCUMENTS

| | | | |
|---|---|---|---|
| 3,942,173 A | | 3/1976 | Wold |
| 5,325,065 A | * | 6/1994 | Bennett et al. ............. 324/661 |
| 5,523,570 A | | 6/1996 | Hairston |
| 5,781,063 A | * | 7/1998 | Kub et al. .................. 327/552 |
| 6,031,570 A | * | 2/2000 | Yang et al. ................. 348/300 |
| 6,166,581 A | | 12/2000 | Liu et al. |
| 6,313,685 B1 | | 11/2001 | Rabii |
| 6,469,561 B1 | * | 10/2002 | Pernigotti et al. .......... 327/336 |
| 6,621,323 B1 | * | 9/2003 | Casper et al. ............... 327/379 |

OTHER PUBLICATIONS

Broesch, J.D. et al., "A Digital Long Pulse Integrator", pp. 1-4.

* cited by examiner

*Primary Examiner*—My-Trang Nu Ton
(74) *Attorney, Agent, or Firm*—Maine & Asmus

(57) ABSTRACT

Techniques for precise removal of offset charge associated with the reset switch of an integration circuit are disclosed. Offset cancellation circuitry includes a single reset offset subtraction circuit and a replica integrator, which is configured identically to the integrators to be offset cancelled. An offset charge is generated by the circuitry and capacitively coupled to the target integrators. This generated offset charge causes voltage at the input node of each target integrator to substantially match the desired starting voltage level of the targeted integration process. Minimal additional space and circuitry is needed. All of the undesired offset charge is cancelled, without canceling any of the desired input current.

26 Claims, 4 Drawing Sheets

AUTOMATIC INTEGRATION RESET OFFSET SUBTRACTION CIRCUIT

STATEMENT OF GOVERNMENT INTEREST

Portions of the present invention may have been made in conjunction with Government funding under contract number DSWA01-98-C-0186, and there may be certain rights to the Government.

FIELD OF THE INVENTION

The invention relates to integration circuitry, and more particularly, to an automatic integration reset offset subtraction circuit.

BACKGROUND OF THE INVENTION

FIG. 1 illustrates a conventional integrator circuit, which includes an operational amplifier 105 configured with an integration capacitor ($C_{int}$) in the feedback loop to the inverting input. The non-inverting input of op-amp 105 is coupled to a bias, which could be, for example, a fixed DC voltage or ground. A reset switch is coupled across the integration capacitor. Such circuits are commonly used in numerous applications, such as in read-out circuits for imaging arrays, and particularly in infrared focal plane arrays (FPA).

In such applications, each cell of the FPA generates a detector current when a scene is imaged. Each detector current generated by the FPA is applied to the input of a corresponding integrator circuit included in the FPA read-out circuit. In operation, the integrator is reset by closing the reset switch, which initializes the integration process to a known starting voltage. The reset switch is then opened to begin integration. Any current (e.g., $I_{input}$) then flowing into the input current node is integrated onto the integration capacitor.

When the reset switch is opened, some leakage or "offset" charge from the reset switch is injected into the inverting input of the op-amp 105 and effectively combines with the input current, $I_{input}$. This charge manifests as an offset from the integrator's starting level, and is therefore referred to herein as an "offset charge" or "reset offset" or "reset offset charge" or "integrator offset" or simply "offset". This offset can consume a large fraction of the voltage range of the integrator, especially if the integration capacitor is small.

Various conventional techniques are available that address integrator offset cancellation. However, such techniques generally require the addition of substantial circuitry and complexity, particularly for designs involving multiple integrator circuits, where each circuit must be modified with the substantial offset cancellation circuitry. Such additional circuitry adds cost and requires additional space, which may not be acceptable for space-limited applications. Moreover, the precise cancellation of the reset offset charge is not trivial. On one hand, the offset cancellation must be done so that only offset charge is cancelled, and not the desired input current. On the other hand, all of the offset charge must be removed, as any residual offset will still adversely impact the voltage range of the integrator.

What is needed, therefore, are techniques for removing offset charge associated with the reset switch.

SUMMARY OF THE INVENTION

One embodiment of the present invention provides a system for canceling offset charge of one or more target integrators, each target integrator having an optimum starting voltage level for integration and an input node where offset charge manifests. The system includes a replica integrator circuit that is configured substantially the same as the one or more target integrators. A sample and hold circuit is adapted to sample and hold output from the replica integrator circuit, wherein the output represents offset charge to be cancelled. An error detector circuit is adapted to receive the output from the sample and hold circuit, and to compare the output to the starting voltage level, and to generate an error output based on the comparison. An offset clock generator circuit is adapted to receive the error output from the error detector circuit, and to generate an offset clock signal that will cause voltage at the input node of each target integrator to substantially match the starting voltage level.

In one such embodiment, the offset clock signal is capacitively coupled to the input node of each of the one or more target integrators and the replica integrator circuit. In another such embodiment, each of the one or more target integrators and the replica integrator include an integration capacitor for integrating charge at the input node, and an offset capacitor for capacitively coupling the offset clock signal to the input node, wherein the integration capacitor and the offset capacitor are substantially equal. In another such embodiment, each of the one or more target integrators and the replica integrator has an inverting input and a non-inverting input, and the input node where offset charge manifests is coupled to the inverting input.

The offset clock generator circuit may further include a filter adapted to suppress noise and limit feedback frequency response for stability. The system may further include a controller that is adapted to provide at least one of reset control signals, enable signals, and timing signals to ensure that integration performed by the replica integrator and the one or more target integrators is not adversely impacted by the system. The one or more target integrators may be included, for example, in a read-out circuit for an imaging array (such as an infrared focal plane array).

Another embodiment of the present invention provides a system for canceling offset charge of one or more target integrators. The system includes one or more target integrators each having a pre-defined starting voltage level for integration, and an input node where offset charge manifests. A replica integrator circuit is configured substantially the same as the one or more target integrators, wherein output of the replica integrator circuit represents an amount of offset charge to be cancelled for each of the one or more target integrators. An offset subtraction circuit is adapted to compare the output from the replica integrator circuit to the starting voltage level, and to generate an offset clock signal that will cause voltage at the input node of each target integrator to substantially match the starting voltage level.

In one such embodiment, the offset clock signal is capacitively coupled to the input node of each of the one or more target integrators and the replica integrator circuit. In another such embodiment, each of the one or more target integrators and the replica integrator include an integration capacitor for integrating charge at the input node, and an offset capacitor for capacitively coupling the offset clock signal to the input node, wherein the integration capacitor and the offset capacitor are substantially equal. In another such embodiment, each of the one or more target integrators and the replica integrator has an inverting input and a non-inverting input, and the input node where offset charge manifests is coupled to the inverting input.

The offset subtraction circuit may further be adapted with a filter to suppress noise and limit feedback frequency response for stability. The system may further include a controller that is adapted to provide at least one of reset control signals, enable signals, and timing signals to ensure that integration performed by the replica integrator and the one or more target integrators is not adversely impacted by the system. The one or more target integrators may be included, for example, in a read-out circuit for an imaging array or any other circuit that employs integration circuitry.

Another embodiment of the present invention provides a system for canceling offset charge of one or more target circuits (e.g., integrators, simple amplifiers, integrators operatively coupled to an imaging array), each target circuit having an input node where offset charge manifests. The system includes a replica circuit that is configured substantially the same as the one or more target circuits, wherein output of the replica circuit represents an amount of offset charge to be cancelled for each of the one or more target circuits. An offset subtraction circuit is adapted to generate a cancellation charge that is equal in magnitude and opposite in polarity to the amount of offset charge to be cancelled.

In one such embodiment, the cancellation charge is capacitively coupled to the input node of each of the one or more target circuits and the replica circuit. In another such embodiment, each of the one or more target circuits and the replica circuit has an inverting input and a non-inverting input, and the input node where offset charge manifests is coupled to the inverting input. The offset subtraction circuit may further include a filter that is adapted to suppress noise and limit feedback frequency response for stability. The system may further include one or more control circuits adapted to provide at least one of reset control signals, enable signals, and timing signals to ensure that function (e.g., integration, amplification, imaging) of the replica circuit and the one or more target circuits is not adversely impacted by the system. The one or more target circuits may be included, for example, in a read-out circuit for an imaging array.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

Embodiments of the present invention enable precise removal of offset charge associated with the reset switch of an integration circuit. The disclosed circuitry includes a reset offset subtraction circuit, which includes a "replica integrator" that is configured identically to the one or more integrators to be offset cancelled. The circuitry effectively operates in-band and controls post-reset integrator output voltage level through capacitive coupling of an offset charge. Minimal additional space and circuitry is needed. All of the offset charge is cancelled, without canceling any of the desired input current.

Reset Offset Subtraction Circuit

Figure 1:
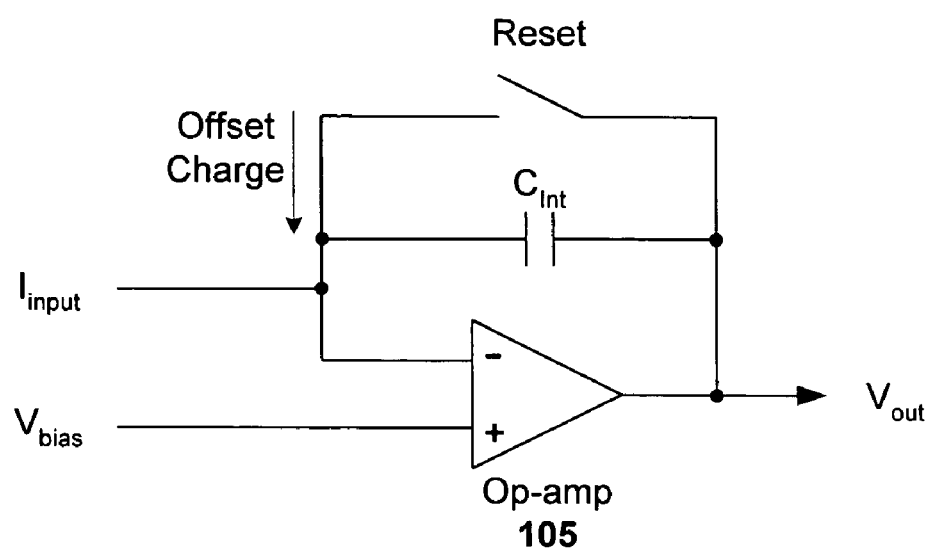
FIG. 1 is a block diagram illustrating a conventional integrator circuit and the undesirable reset offset charge that is injected into the input during integration.
Figure 2:
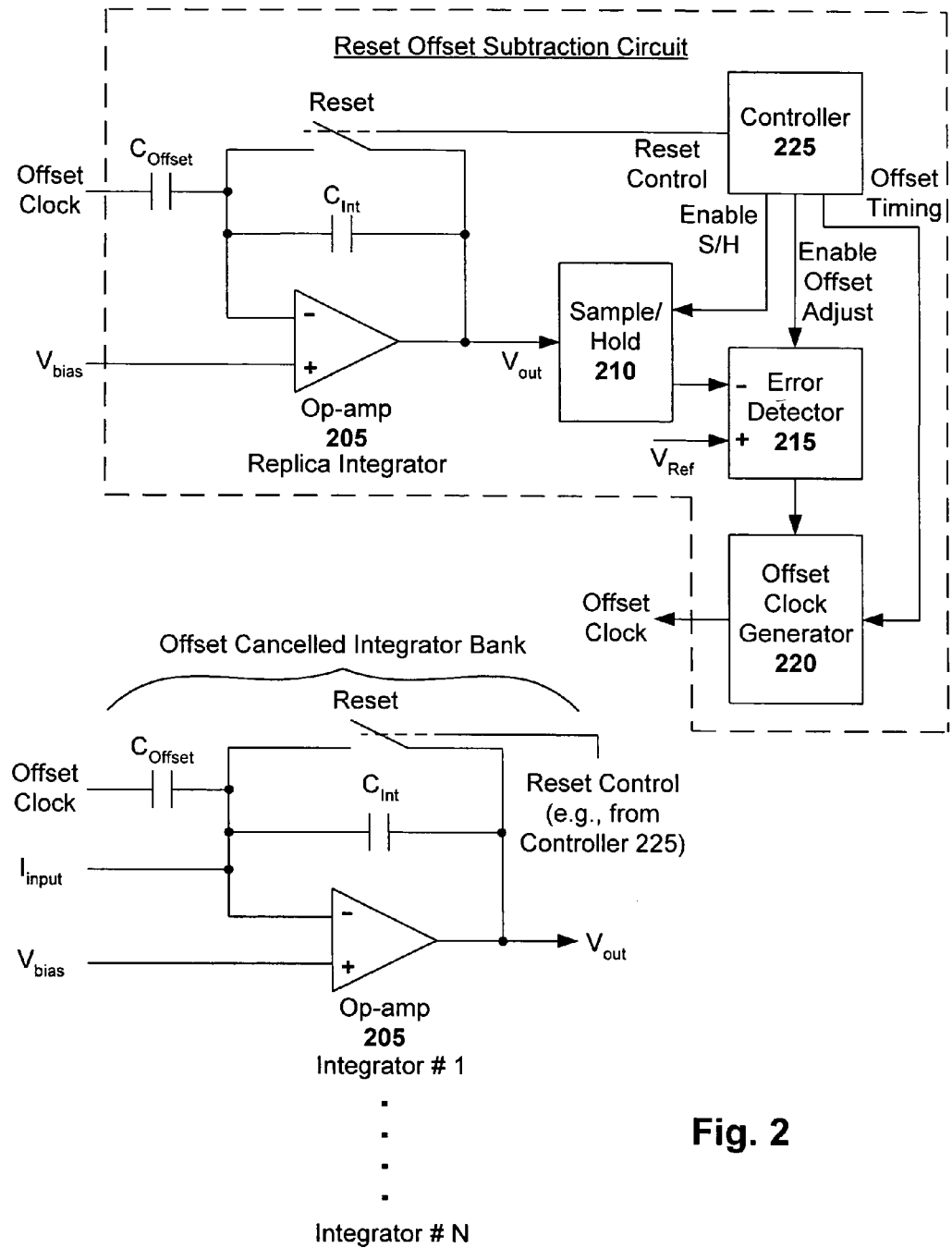
FIG. 2 is a block diagram illustrating an automatic integration reset offset subtraction circuit configured in accordance with one embodiment of the present invention.

FIG. 2 is a block diagram illustrating an automatic integration reset offset subtraction circuit configured in accordance with one embodiment of the present invention. As can be seen, the reset offset subtraction circuit includes a "replica integrator" and generates an offset clock signal that is provided to one or more target integrator circuits that each perform the desired integration function. In the example application shown, there are a plurality of identical target integrators (1 through N) included in a bank, where each integrator in the bank is offset cancelled by the single reset offset subtraction circuit. Such a bank of integrator circuits is commonly used, for example, in read-out circuits for large imaging arrays (e.g., infrared focal plane arrays, cooled or uncooled). However, even applications using a single target integrator can employ the principles of the present invention.

In this example application, each of the target integrators (1 through N), and the replica integrator of the reset offset subtraction circuit, include an operational amplifier 205, which is configured with an offset capacitor ($C_{offset}$), an integration capacitor ($C_{int}$), and a reset switch (Reset). The reset offset subtraction circuit also includes a sample and hold module 210, an error detector 215, an offset clock generator 220, and a controller 225. Note that the replica integrator is identically configured to each of the one or more target integrators included in the bank, including the offset capacitor ($C_{offset}$), integration capacitor ($C_{int}$), op-amp 205, and the reset switch. Further note that the term "identical" is intended to include suitable equivalents also.

The only circuitry that is added to the existing target integrator circuit design is the offset capacitor ($C_{offset}$), with the other circuitry being part of the original design. This assumes of course, that a comparable capacitor is not already included in the original design. In one embodiment, the offset capacitor $C_{offset}$ is substantially identical to the integration capacitor $C_{int}$. An offset clock signal generated by the reset offset subtraction circuit is provided to the offset capacitor of the replica integrator and to each of the offset capacitors of each target integrator, which operates to cancel the undesired offset. A bias signal ($V_{bias}$) is also applied to both the replica integrator and to each target integrator as shown. Note that the bias signal $V_{bias}$ could be, for example, ground or any DC voltage, depending on the particular circuit design and component selection. Further note that no integration current ($I_{input}$) is applied to the replica integrator.

In the embodiment shown, the controller 225 is configured to provide the reset control signal to open and close the reset switches of each integrator (targets and replica) pursuant to an established integration scheme. The controller 225 is also configured to provide an enable S/H signal that enables operation of the sample and hold module 210, and an enable offset adjust signal that enables operation of the error detector 215. The controller 225 also provides an offset timing signal to the offset clock generator 220. Note that the reset control, enable signals, and offset timing signal can be synchronized, such that the active integration process (performed by the replica and target integrators) is not adversely impacted by the offset cancellation process. The relationship and timing of the control, enable, and offset timing signals is discussed in more detail with reference to FIG. 4. Various timing and synchronization schemes will be apparent in light of this disclosure.

Note that the controller 225 is shown as part of the reset offset subtraction circuit in the embodiment shown in FIG. 2. In alternative embodiments, the functions of the controller 225 can be provided by other circuitry external to the reset offset subtraction circuit. The functions may be performed, for example, by a single external controller module. Alternatively, the controller functions can be provided by individual circuits, where the reset control signal is provided by one circuit, the enable S/H signal is provided by another circuit, the enable offset adjust signal is provided by another circuit, and offset timing signal is provided by another circuit. In any case, the S/H module 210, the error detector 215, and the offset clock generator 220 operate in conjunction with the replica integrator (including the offset capacitor $C_{offset}$) to cancel offset of one or more target integrators.

In operation, the integration process is initialized by closing the reset switch (e.g., based on the reset control signal output by the controller 225), which sets the input node (at each of the op-amp 205 inverting inputs) to the integration starting voltage level. Note that the reset switch of the replica integrator and the reset switch of the one or more target integrators are closed at the same time for this initialization. The reset switches are then simultaneously opened (based on the reset control signal output by the controller 225) to begin integration, where any current then flowing into the inverting input of each target integrator is integrated onto the corresponding integration capacitor $C_{int}$. Each reset switch can be implemented, for example, by a field effect transistor or other suitable switching mechanism.

As previously explained, when the reset switch is in its open state, some charge is injected into the corresponding inverting input by the switch. This charge manifests as an offset from the integrator's starting voltage level. Recall that this offset can consume a large fraction of the integration range, particularly if the integration capacitor is small. An offset capacitor $C_{offset}$ is therefore provided for each target integrator, to facilitate subtraction of this offset from the input node. Further recall that each target integrator and the replica integrator is configured with an identical offset capacitor $C_{offset}$, which can be equivalent to the integration capacitor $C_{int}$. The offset clock line is connected to the other side of the offset capacitor $C_{offset}$.

Figure 4:
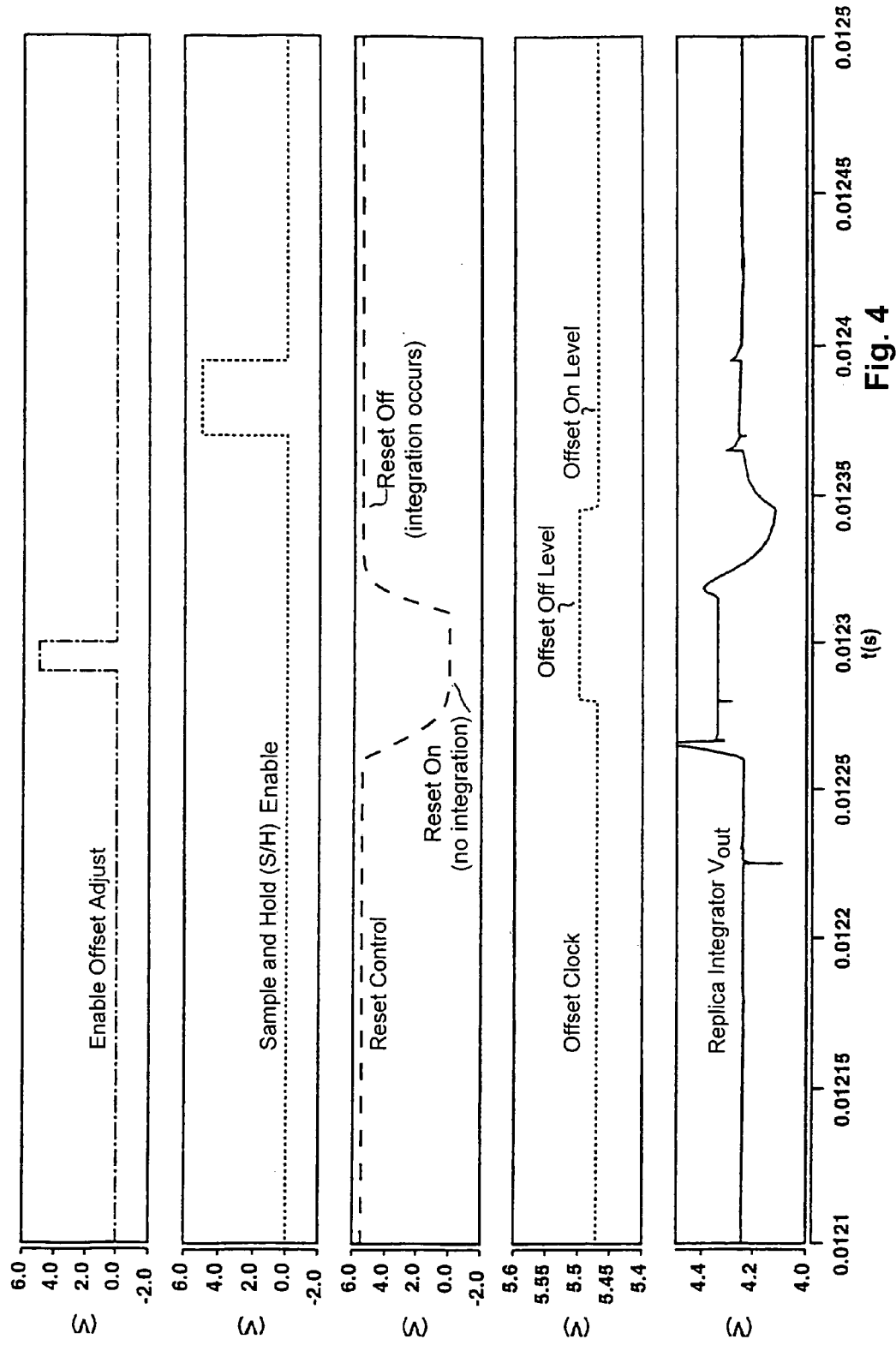
FIG. 4 is a timing diagram illustrating signal and timing relationships associated with the circuits of FIGS. 2 and 3.

During integration reset, the offset clock that is generated by the offset clock generator 220 is set to an "offset off level." After the reset is complete, the offset clock is set to its "offset on level." FIG. 4 shows these levels of the offset clock signal, as well as other pertinent enable and control signals. This injection of the offset clock signal into the offset capacitor $C_{offset}$ effectively operates to remove the offset charge from the input node. The aim is to remove only the charge injected by the reset switch. Thus, the replica integrator is used to ensure that the correct amount of charge is removed. As previously explained, the replica integrator is an identical copy of the target integrator, except that it has nothing connected to its input; thus, it does not integrate anything other than the offset charge.

The output of the replica integrator is sampled by the sample and hold module 210, to remove any reset transients from the output. The error detector 215 receives the sampled signal and compares it to a reference voltage ($V_{Ref}$), which is the optimum starting voltage level for the integrator. The error detector 215 can be implemented, for example, using a conventional comparator technology (e.g., discrete comparator device or op-amp based comparator. The error detector 215 generates an error output which is applied to the offset clock generator circuit 220.

The offset clock generator circuit 220 is configured to increase or decrease the voltage level of the offset clock output, so that the voltage at the inverting input of each target integrator matches the reference level $V_{Ref}$. In the embodiment shown in FIG. 2, the polarities of the circuits are arranged so that there is negative feedback around the entire loop. A filter may be included in the clock generation circuit to suppress noise and limit the feedback frequency response for stability.

Figure 3:
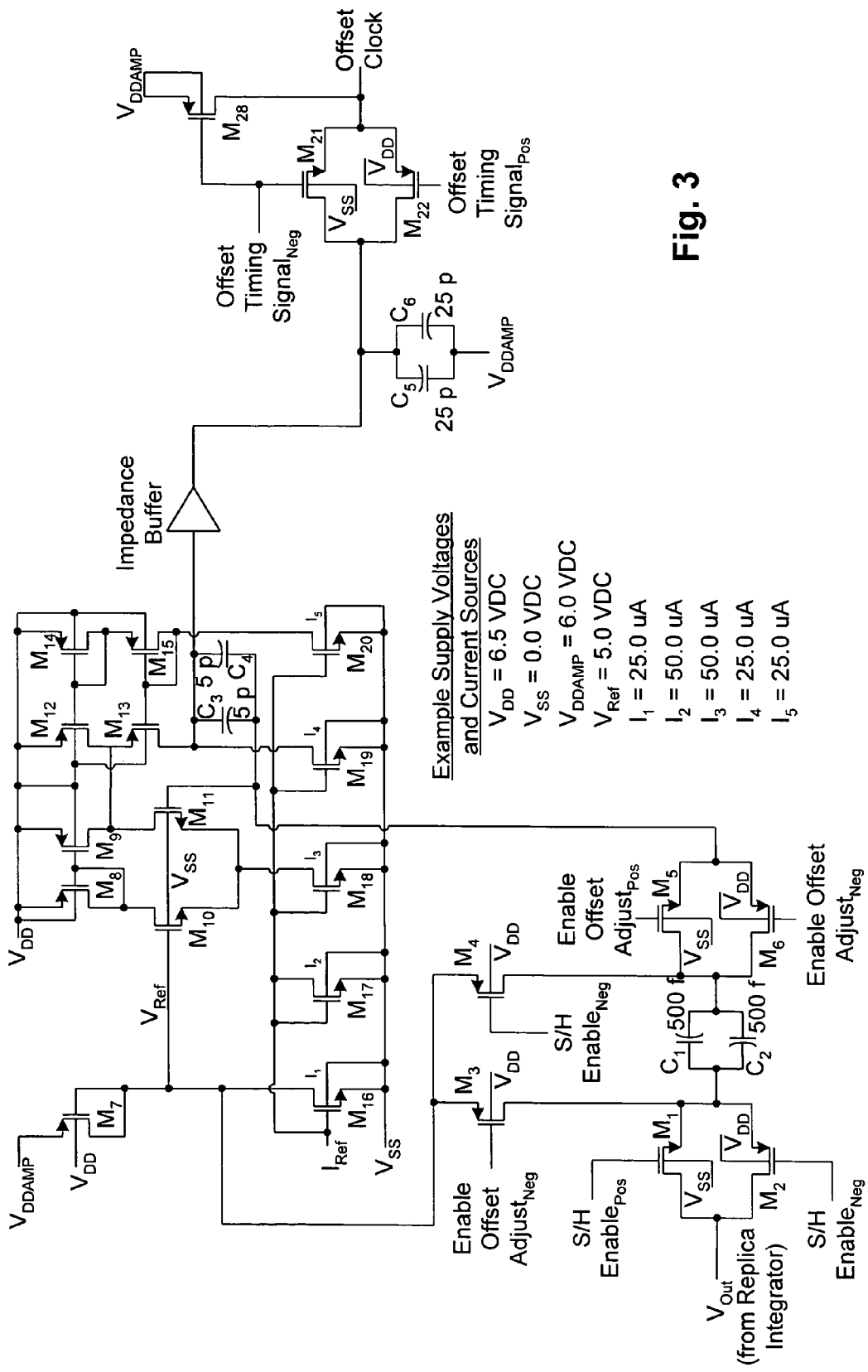
FIG. 3 is a schematic diagram illustrating circuitry of an automatic integration reset offset subtraction circuit configured in accordance with one embodiment of the present invention.

FIG. 3 is a schematic diagram illustrating circuitry of an automatic integration reset offset subtraction circuit configured in accordance with one embodiment of the present invention. In particular, the circuitry includes examples of the sample and hold module 210, the error detector 215, and the offset clock generation circuit 220. The configuration of the replica integrator will depend on the target integrator to be offset cancelled.

$V_{Ref}$, which is derived for $V_{SS}$ and $V_{DDAMP}$, is provided by FETs M7 and M16. The sample and hold 210 essentially includes field effect transistors (FETs) M1, M4, and M2, and storage capacitors C1 and C2. The error detector 215 and an offset bias generation function of the offset clock generator 220 are combined into one feedback amplifier circuit which includes FETs M3, M5, M6, M8, M9, M10, M11, M18, M12, M13, M14, M15, M19, M20, and filter capacitors C3 and C4. Also included in the offset clock generator 220 of this example is a clock driver, which includes an impedance buffer, filter capacitors C5 and C6, and FETs M21, M22 and M28. FETs M16, M18, M19, and M20 each act as current sources, with M17 setting the bias voltage for each current source based on an external reference current (which is designated $I_{Ref}$ in FIG. 3).

As can be seen, the error detector 215 and the offset clock generator 220 are combined in one feedback loop that also includes noise filtering. Numerous implementation details and alternative configurations will be apparent in light of this disclosure, and the present invention is not intended to be limited to any one particular embodiment. Implementation details such as component selection, FET geometries, power supply voltages, and the use of differential signals will vary from one application to the next.

In this particular embodiment, the sample and hold (S/H) enable signal and the enable offset adjust signal are provided as differential signals, which can be achieved with a number of conventional techniques. For example, inverters can be used to generate complement signals of the original signals. Each pair of the complementary signals (S/H Enable$_{Pos}$ and S/H Enable$_{Neg}$, and Enable Offset Adjust$_{Pos}$ and Enable Offset Adjust$_{Neg}$) can then be provided to level shifters to provide the desired voltage levels, as necessary. Such level shifting may be used, for instance, if transferring the control, timing, and enable signals from the digital domain to the analog domain. Only the analog domain is shown here, but various other analog and/or digital implementations will be apparent in light of this disclosure.

The offset timing signal is also provided as a differential signal, and enables the transmission gate (FETs M21 and M22) and pull-up (FET M28) of the clock generation circuit. In particular, the complementary offset timing signals (Offset Timing Signal$_{Neg}$ and Offset Timing Signal$_{Pos}$) are provided to the respective gates of FETs M21 and M22. The Offset Timing Signal$_{Neg}$ is also provided to the gate of M28. Thus, when the transmission gate formed by M21 and M22 is on, the pull-up M28 is off, and vice-versa. Note that additional logic could be added here to provide a high impedance state, where both the transmission gate and the pull-up are off.

Control and Timing

FIG. 4 is a timing diagram illustrating various signals and timing relationships associated with the circuits of FIGS. 2 and 3. As can be seen, the enable offset adjust signal goes high, which causes the replica integrator output $V_{out}$ previously captured by the sample and hold module 210 to be received by the error detector 215. Note that the S/H enable signal illustrated in FIG. 4 goes active (high) after the enable offset signal adjust to capture the next output cycle of the replica integrator, once the current cycle of captured output data has been applied to the error detector 215. Thus, the integration cycle is allowed to take place without being adversely impacted by operation of the reset subtraction circuit.

During integration reset (when the reset control is low), the offset clock that is generated by the offset clock generator 220 is set to an "offset off level." After the reset is complete and goes high, the offset clock is set to its "offset on level." This removes the undesired reset offset charge (which is substantially the same as the generated offset off level, but with opposite polarity) from the input node of the replica integrator, as well as each target integrator. The undesired offset can be seen in the replica integrator output $V_{out}$ just after the reset control goes to its off position (which is high in this case), where a dip in voltage occurs at about 0.01235 seconds. This output $V_{out}$ is captured by the sample and hold 210, for post-reset processing to adjust the integrator output voltage level through capacitive coupling of the offset clock charge. The process can be repeated for each integration/reset cycle.

Note that the offset timing signal (which is shown in FIGS. 2 and 3, and clocks the output of the offset clock generator 220) essentially has its edges aligned with the offset clock signal (shown in FIG. 4) that is generated by the offset clock generator 220. The offset timing signal, however, will have its low and high voltage levels set accordingly (e.g., low at 0.0 VDC and high at 5.0 VDC).

The foregoing description of the embodiments of the invention has been presented for the purposes of illustration and description. It is not intended to be exhaustive or to limit the invention to the precise form disclosed. Many modifications and variations are possible in light of this disclosure. For example, the offset subtraction circuit described herein could also be used to cancel or otherwise remove offsets other than integrator reset charge for array applications, as long as the offsets are relatively uniform across the array.

One type of offset that could be a desirable candidate for cancellation is due to the reset level of a simple amplifier design (such as those included in an array readout circuit). Simple amplifiers have a number of virtues (e.g., low power, small area, low noise), but may not reset to the optimum level for dynamic range. In particular, a single input amplifier naturally resets about one threshold away from the power supply. By adjusting the reference bias of the amplifier, the reset level could be moved closer to the power supply, thereby increasing the dynamic range. In such an embodiment of the present invention, the replica circuit would be a copy of the simple amplifier. Just as described herein, the cancellation charge can be capacitively coupled to the amplifier's reference bias input node of the one or more target amplifiers and the replica amplifier circuit.

Another type of offset that could be removed from imaging arrays is due to the detector current, which may have components that are always present and contain no useful scene signal (generally referred to as dark current). If the output sampling occurs later in the integration and the replica integrator had a detector on it (e.g., one pixel output operatively coupled to the inverting input, so as to provide a "replica background signal"), then some detector dark current or other background photocurrent could also be subtracted. Numerous other applications will be apparent in light of this disclosure, where a replica circuit (e.g., integrator, amplifier, or any other circuit that has a node where offset signal accumulates) is used in conjunction with a cancellation charge generator circuit (e.g., sample and hold 210, error detector 215, offset clock generator 220, and controller 225). The cancellation charge generated based on performance of the replica circuit can then be applied to the accumulating node of each of the one or more target circuits, so as to eliminate the offsets (or other such undesired signal) to improve circuit performance.

It is intended that the scope of the invention be limited not by this detailed description, but rather by the claims appended hereto.

What is claimed is:

1. A system for canceling offset charge of one or more target integrators, each target integrator having an optimum starting voltage level for integration and an input node where offset charge manifests, the system comprising:
    a replica integrator circuit configured substantially the same as the one or more target integrators;
    a sample and hold circuit adapted to sample and hold output from the replica integrator circuit, wherein the output represents offset charge to be cancelled;
    an error detector circuit adapted to receive the output from the sample and hold circuit, and to compare the output to the starting voltage level, and to generate an error output based on the comparison; and
    an offset clock generator circuit adapted to receive the error output from the error detector circuit, and to generate an offset clock signal that will cause voltage at the input node of each target integrator to substantially match the starting voltage level.

2. The system of claim 1 wherein the offset clock signal is capacitively coupled to the input node of each of the one or more target integrators and the replica integrator circuit.

3. The system of claim 1 wherein each of the one or more target integrators and the replica integrator include an integration capacitor for integrating charge at the input node, and an offset capacitor for capacitively coupling the offset clock signal to the input node, wherein the integration capacitor and the offset capacitor are substantially equal.

4. The system of claim 1 wherein each of the one or more target integrators and the replica integrator has an inverting input and a non-inverting input, and the input node where offset charge manifests is coupled to the inverting input.

5. The system of claim 1 wherein the offset clock generator circuit further includes a filter adapted to suppress noise and limit feedback frequency response for stability.

6. The system of claim 1 further including a controller adapted to provide at least one of reset control signals, enable signals, and timing signals to ensure that integration performed by the replica integrator and the one or more target integrators is not adversely impacted by the system.

7. The system of claim 1 wherein the one or more target integrators are included in a read-out circuit for an imaging array.

8. A system for canceling offset charge of one or more target integrators, comprising:
- one or more target integrators each having a pre-defined starting voltage level for integration, and an input node where offset charge manifests;
- a replica integrator circuit configured substantially the same as the one or more target integrators, wherein output of the replica integrator circuit represents an amount of offset charge to be cancelled for each of the one or more target integrators; and
- an offset subtraction circuit adapted to compare the output from the replica integrator circuit to the starting voltage level, and to generate an offset clock signal that will cause voltage at the input node of each target integrator to substantially match the starting voltage level.

9. The system of claim 8 wherein the offset clock signal is capacitively coupled to the input node of each of the one or more target integrators and the replica integrator circuit.

10. The system of claim 8 wherein each of the one or more target integrators and the replica integrator include an integration capacitor for integrating charge at the input node, and an offset capacitor for capacitively coupling the offset clock signal to the input node, wherein the integration capacitor and the offset capacitor are substantially equal.

11. The system of claim 8 wherein each of the one or more target integrators and the replica integrator has an inverting input and a non-inverting input, and the input node where offset charge manifests is coupled to the inverting input.

12. The system of claim 8 wherein the offset subtraction circuit is further adapted with a filter to suppress noise and limit feedback frequency response for stability.

13. The system of claim 8 further including a controller adapted to provide at least one of reset control signals, enable signals, and timing signals to ensure that integration performed by the replica integrator and the one or more target integrators is not adversely impacted by the system.

14. The system of claim 8 wherein the one or more target integrators are included in a read-out circuit for an imaging array.

15. A system for canceling offset charge of one or more target integrators, each target integrator having an input node where offset charge manifests, the system comprising:
- a replica integrator circuit configured substantially the same as the one or more target integrators, wherein output of the replica integrator circuit represents an amount of offset charge to be cancelled for each of the one or more target integrators; and
- an offset subtraction circuit adapted to receive the output of the replica integrator circuit and generate a cancellation charge that is equal in magnitude and opposite in polarity to the amount of offset charge to be cancelled.

16. The system of claim 15 wherein the cancellation charge is capacitively coupled to the input node of each of the one or more target integrators and the replica integrator circuit.

17. The system of claim 15 wherein each of the one or more target integrators and the replica integrator has an inverting input and a non-inverting input, and the input node where offset charge manifests is coupled to the inverting input.

18. The system of claim 15 wherein the offset subtraction circuit further includes a filter adapted to suppress noise and limit feedback frequency response for stability.

19. The system of claim 15 further including one or more control circuits adapted to provide at least one of reset control signals, enable signals, and timing signals to ensure that integration performed by the replica integrator and the one or more target integrators is not adversely impacted by the system.

20. The system of claim 15 wherein the one or more target integrators are included in a read-out circuit for an imaging array.

21. A system for canceling offset charge of one or more target circuits, each target circuit having an input node where offset charge manifests, the system comprising:
- a replica circuit configured substantially the same as the one or more target circuits, wherein output of the replica circuit represents an amount of offset charge to be cancelled for each of the one or more target circuits; and
- an offset subtraction circuit adapted to receive the output of the replica integrator circuit and generate a cancellation charge that is equal in magnitude and polarity to the amount of offset charge to be cancelled.

22. The system of claim 21 wherein the cancellation charge is capacitively coupled to the input node of each of the one or more target circuits and the replica circuit.

23. The system of claim 21 wherein each of the one or more target circuits and the replica circuit has an inverting input and a non-inverting input, and the input node where offset charge manifests is coupled to the inverting input.

24. The system of claim 21 wherein the offset subtraction circuit further includes a filter adapted to suppress noise and limit feedback frequency response for stability.

25. The system of claim 21, further including one or more control circuits adapted to provide at least one of reset control signals, enable signals, and timing signals to ensure that function of the replica circuit and the one or more target circuits is not adversely impacted by the system.

26. The system of claim 21 wherein the one or more target circuits are included in a read-out circuit for an imaging array.

* * * * *